United States Patent [19]

Bourdeau

[11] Patent Number: 5,754,053
[45] Date of Patent: May 19, 1998

[54] IN SERVICE CABLE FAILURE DETECTOR AND METHOD

[75] Inventor: Richard Bourdeau, St-Laurent, Canada

[73] Assignee: Harris Corporation, Melbourne, Fla.

[21] Appl. No.: 654,412

[22] Filed: May 28, 1996

[51] Int. Cl.$^6$ .................................................. G01R 31/11
[52] U.S. Cl. .............................................. 324/533; 324/534
[58] Field of Search .................................... 324/533, 532, 324/512, 534, 642; 379/26

[56] References Cited

U.S. PATENT DOCUMENTS 2,887,652  5/1959  Bendayan ............................ 324/534
3,244,975  4/1966  Bauer ................................. 324/534

*Primary Examiner*—Christine K. Oda
*Attorney, Agent, or Firm*—Rogers & Killeen

[57] ABSTRACT

A device and method for detecting a fault in a cable while the cable is in use. A low frequency analog test signal is added to the signal normally sent across the cable under test. Under normal operating conditions the test signal does not reflect from the load which terminates the cable. Under fault conditions, the test signal is reflected and is detected by an analog test signal detector.

15 Claims, 2 Drawing Sheets

IN SERVICE CABLE FAILURE DETECTOR AND METHOD

BACKGROUND OF THE INVENTION

The present invention relates to an apparatus and method for detecting a fault in a cable or other electrical conductor. Such a device may be used to detect a failure in a conductor, such as a cable, which conveys data or power between the two ends thereof.

Continuity faults in a conductor may be detected with a DC level detector which falls to zero in the case of an open circuit or to a reduced level in the case of increased impedance. A disadvantage of such detectors is that they necessarily consume significant amounts of power in constantly supplying a direct current.

Other systems identify the location of discontinuities in conductors. Such systems rely on highly accurate measurements of time between reflections of a signal to estimate the location of a discontinuity, a conductor topography which provides multiple reflections, or the generation of discrete pulse signals to perform discontinuity location estimation. These requirements lead to a complicated and potentially costly digital implementation of the detection device.

Other fault detection systems have been developed for use with cables which carry a single frequency signal. While fault detection may accomplished by reflection analysis of the single frequency signal, this approach is not applicable for a data signal cable in which signal components have a wide frequency range.

Accordingly, it is an object of the present invention to provide a novel apparatus and method for detecting a cable fault through use of a low power AC signal so as to obviate the problems of the prior art.

It is another object of the present invention to provide a novel apparatus and method for detecting a cable continuity fault through use of an AC test signal which is combined with a data or power signal carried by the cable.

It is yet another object of the present invention to provide a novel apparatus and method of detecting a cable continuity fault through purely analog means.

It is still another object of the present invention to provide a novel apparatus and method of detecting cable continuity faults by supplying a sinusoidal signal to the cable and detecting reflections from a continuity fault.

It is a further object of the present invention to provide a novel apparatus and method of detecting increased impedance in a cable which has a first end connected to a terminal that does not reflect signals in a frequency range of an analog test signal and a second end connected to an analog test signal generator and an analog test signal detector, in which the analog test signal generator applies the analog test signal to the cable, in which the analog test signal detector detects a reflection of the analog test signal caused by a source of increased impedance in the cable, and in which the analog test signal does not reach the analog test signal detector if the source of increased impedance is not present in the cable.

It is yet a further object of the present invention to provide a novel apparatus and method of detecting a fault in a cable carrying a data/power signal and which has an end terminated so that it does not reflect signals in a frequency range of a test signal, by providing an analog test signal of a lower frequency than the lowest frequency of the data/power signal and combining the test signal and the data/power signal, providing the combined signal to the cable at an end remote from the terminated end, and detecting reflections of the test signal with an analog detector at the end of the cable remote from the terminated end, where any detection of a reflection indicates a fault in the cable.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

A preferred embodiment of the method of the present invention for detecting a fault (i.e., increased impedance) in a cable under test relies entirely on analog signals to detect a fault. The cable may have a first end connected to a terminal (e.g., a load) that does not reflect signals in a frequency range of an analog test signal and a second end connected to an analog test signal generator and an analog test signal detector. The analog test signal generator may apply the analog test signal to the cable at its second end continuously or periodically, and the analog test signal detector may detect a reflection of the analog test signal caused by a fault in the cable. The analog test signal does not reach the analog test signal detector if the source of increased impedance is not present in the cable. That is, the analog test signal may be applied to the cable continuously, but will only reach the detector if there is a fault.

In a further preferred embodiment the analog test signal may be combined with a data/power signal (a data or power signal) being conveyed through the cable under test before applying the analog test signal to the cable. Further, the analog test signal may be routed through a signal splitter/combiner before being applied to the cable. The fault-caused reflection of the analog test signal may also be routed through the signal splitter/combiner before being provided to the analog test signal detector. The analog test signal detector may be a phase locked loop or a bandpass filter followed by a peak detector.

Figure 1:
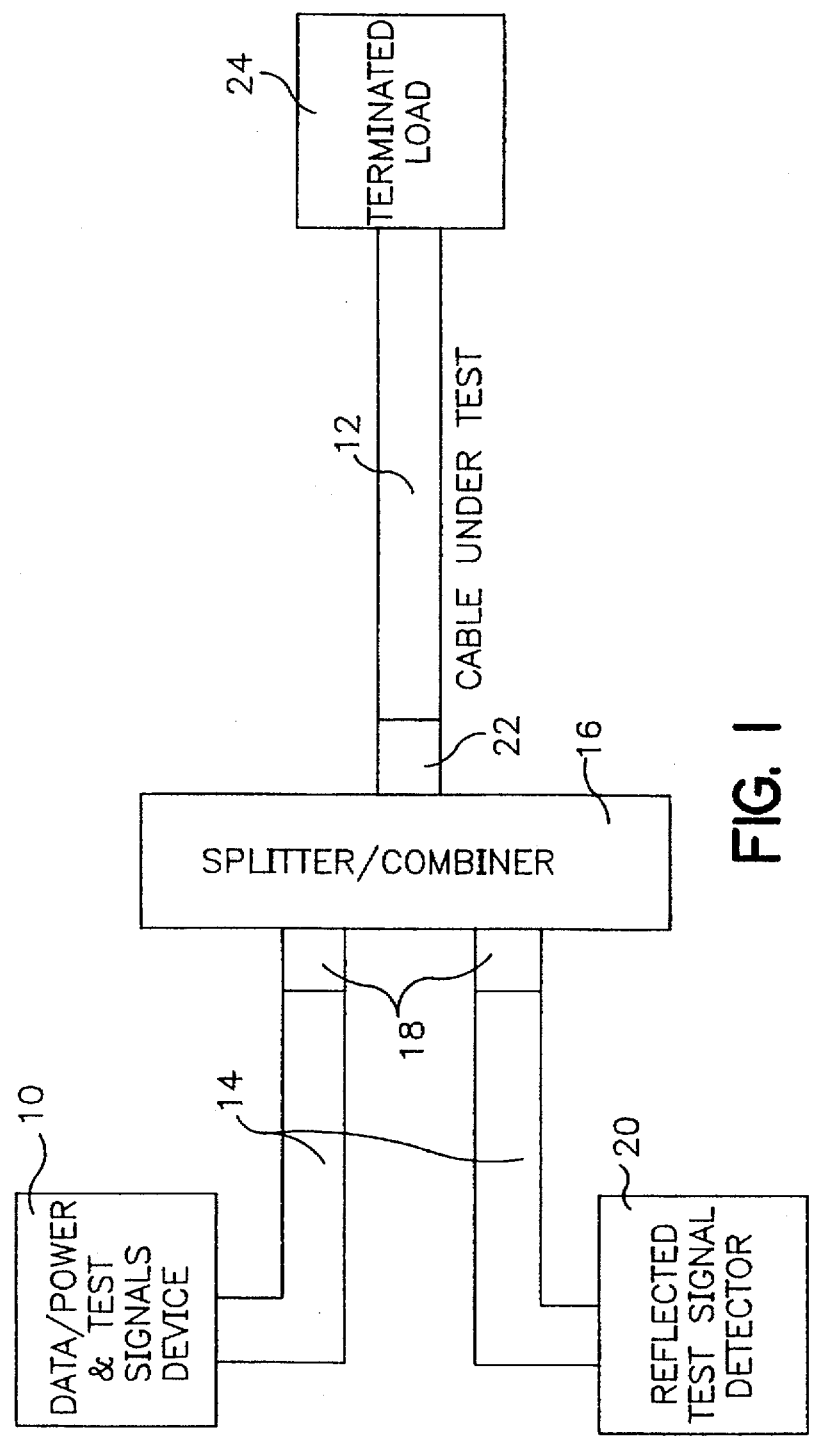
FIG. 1 is a block diagram of embodiment of the present invention in which the test signal and data/power signal come from the same source.

With reference now to FIG. 1, a preferred embodiment of the present invention may include a signal source 10 which provides a data/power signal to be carried by a cable 12 and which generates an analog test signal. The data/power signal may be either data or power, and may be generated elsewhere and provided to source 10 where it may be combined with the analog test signal generated by source 10. Source 10 may be connected to cable 12 through a conductor 14 and a signal splitter/combiner 16 with node 18. An analog test signal detector 20 may also be connected to cable 12 through a conductor 14 and splitter/combiner 16 with a node 18. Cable 12 may be connected at an end remote from splitter/combiner 16 to a terminal 24. Each of these components may be conventional.

By way of example, terminal 24 may be an outdoor radio transmitter and source 10 may be an indoor source of a data signal which is to be transmitted, or a power source for the transmitter. The analog test signal may be applied to a cable connecting the outdoor and indoor components whenever a signal is being transmitted so that an immediate indication of cable failure may be available.

In operation, device 10 may supply both the data/power signal meant to be conducted by cable 12 and the analog test signal used to detect a fault in cable 12. The analog test signal may be a sinusoid of a lower frequency than the lowest frequency component of the data/power signal. When there are no faults in cable 12, terminal 24 prevents reflection of the analog test signal back through cable 12 to splitter/combiner 16. Elements of the data/power signal may reflect back to splitter/combiner 16, but will not be detected by detector 20 which is desirably tuned to detect only the analog test signal. When there is a fault in cable 12, part or all of the analog test signal will be reflected back through cable 12 to splitter/combiner 16 which provides the reflected analog test signal to detector 20. As will be appreciated, the test of the cable is not dependent on the length of cable 12 and requires little power. Many systems already have a source of a relatively low frequency signal (e.g., a tone) and in such systems the tone may be used as the analog test signal and the only added cost may be for the tone detector.

Detector 20 may be a suitable analog detector, such as a phase locked loop or bandpass filter followed by a peak detector, or other analog detection device for detecting the reflected analog test signal, but not the data/power signal. With this arrangement, any reflection detected by detector 20 indicates the presence of a fault in cable 12.

Figure 2:
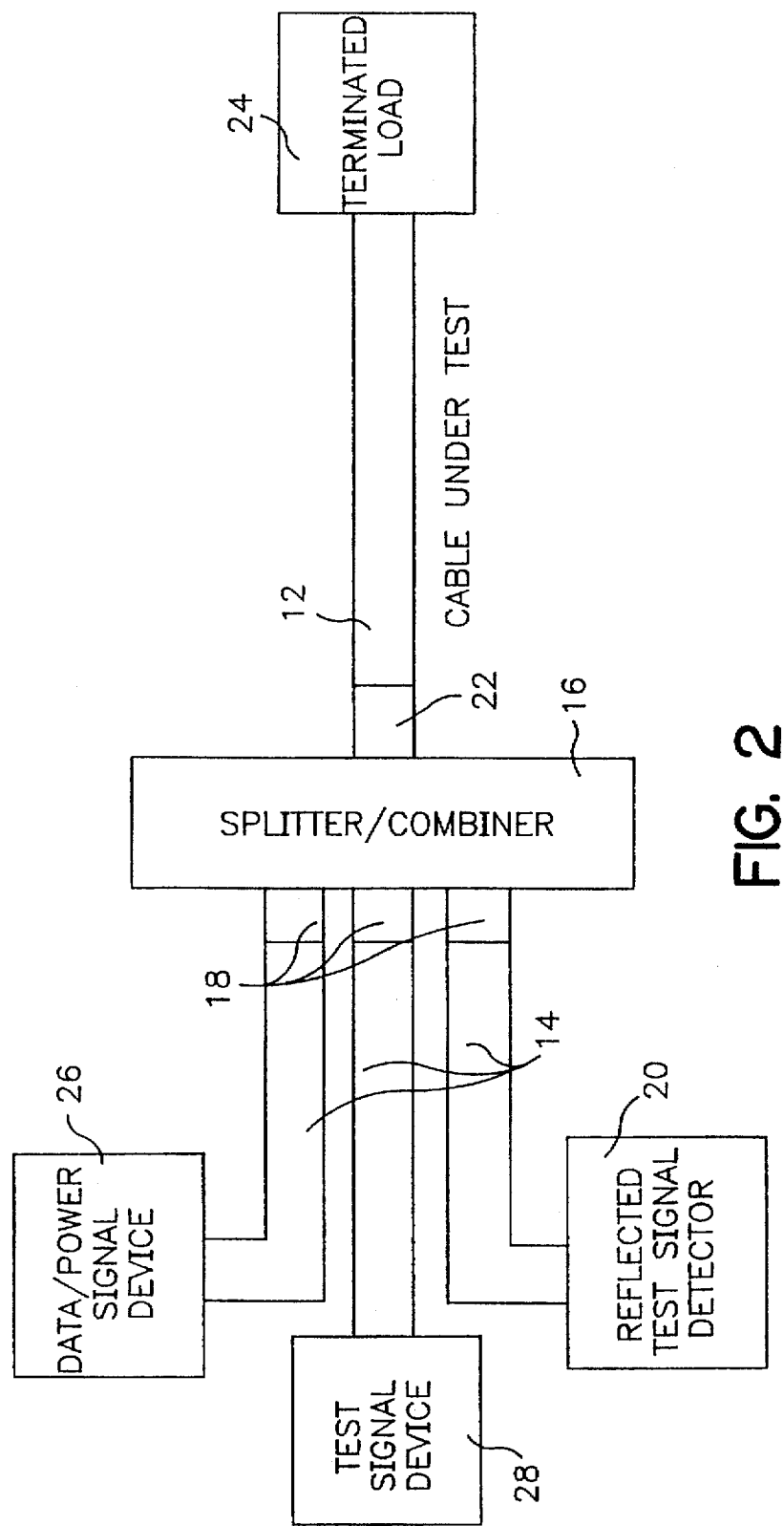
FIG. 2 is a block diagram of a further embodiment of the present invention in which the test signal and data/power signal come from different sources.

In an alternative embodiment, the analog test signal generator may be separate from the source of the data/power signal, as illustrated in FIG. 2. In this embodiment the signal from data/power signal source 26 may be combined with the analog test signal from test signal generator 28 in splitter/combiner 16.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of detecting increased impedance in a cable under test which has a first end connected to a terminal that does not reflect signals in a frequency range of an analog test signal and a second end connected to an analog test signal generator and an analog test signal detector, the method comprising the steps of:

(a) at the second end, applying from the analog test signal generator the analog test signal to the cable under test; and (b) at the second end, detecting with the analog test signal detector a reflection of the analog test signal caused by a source of increased impedance in the cable under test, wherein the analog test signal does not reach the analog test signal detector if the source of increased impedance is not present in the cable under test.

2. A method of detecting increased impedance in a cable under test which has a first end connected to a terminal that does not reflect signals in a frequency range of an analog test signal and a second end connected to an analog test signal generator and an analog test signal detector, the method comprising the steps of:

(a) at the second end, applying from the analog test signal generator the analog test signal to the cable under test;

(b) combining the analog test signal with a data/power signal being conveyed through the cable under test before applying the analog test signal to the cable under test; and (c) at the second end, detecting with the analog test signal detector a reflection of the analog test signal caused by a source of increased impedance in the cable under test, wherein the analog test signal does not reach the analog test signal detector if the source of increased impedance is not present in the cable under test.

3. A method of detecting increased impedance in a cable under test which has a first end connected to a terminal that does not reflect signals in a frequency range of an analog test signal and a second end connected to an analog test signal generator and an analog test signal detector, the method comprising the steps of:

(a) at the second end, applying from the analog test signal generator the analog test signal to the cable under test;

(b) routing the analog test signal through a signal splitter/combiner before applying the analog test signal to the cable under test; and (c) at the second end, detecting with the analog test signal detector a reflection of the analog test signal caused by a source of increased impedance in the cable under test and routing the reflection of the analog test signal through the signal splitter/combiner before providing the reflection to the analog test signal detector, wherein the analog test signal does not reach the analog test signal detector if the source of increased impedance is not present in the cable under test.

4. The method of claim 3 further comprising the step of combining the analog test signal with a data/power signal being conveyed through the cable under test before routing the analog test signal to the signal splitter/combiner.

5. A method of detecting increased impedance in a cable under test which has a first end connected to a terminal that does not reflect signals in a frequency range of an analog test signal and a second end connected to an analog test signal generator and an analog test signal detector, the analog test signal detector being one of a phase locked loop and a bandpass filter with a peak detector, the method comprising the steps of:

(a) at the second end, applying from the analog test signal generator the analog test signal to the cable under test; and (b) at the second end, detecting with the analog test signal detector a reflection of the analog test signal caused by a source of increased impedance in the cable under test, wherein the analog test signal does not reach the analog test signal detector if the source of increased impedance is not present in the cable under test.

6. A method of detecting a fault in a cable under test carrying a data/power signal, the cable under test having an end terminated so that it does not reflect signals in a frequency range of a test signal, the method comprising the steps of:

(a) providing an analog test signal of a lower frequency than the lowest frequency of the data/power signal;

(b) combining the test signal and the data/power signal;

(c) providing the combined signal to the cable under test at an end remote from the terminated end; and (d) detecting reflections of the test signal with an analog detector at the end of the cable remote from the terminated end, where any detection of a reflection indicates a fault in the cable.

7. The method of claim 6 further comprising the step of connecting the cable under to test to a source of the data/power signal, a source of the analog test signal, and a detector of the reflected test signal through a signal splitter/combiner.

8. The method of claim 6 further comprising the step of providing a band pass filter with peak detector as the detector of the reflected test signal.

9. The method of claim 6 further comprising the step of providing a phase locked loop as the detector of the reflected test signal.

10. The method of claim 6 further comprising the step of providing the analog test signal continuously while the cable under test is carrying the data/power signal.

11. A fault detector for testing a cable having a terminated load at a first end which does not reflect test signals of a specified frequency, comprising:

an analog test signal generator for providing an analog test signal of the specified frequency;

an analog test signal detector for detecting a reflection of the analog test signal caused by a fault in the cable; and a splitter/combiner connected to a second end of the cable and to said analog test signal generator and said test signal detector for applying the analog test signal to the second end of the cable and for receiving the reflection of the analog test signal from the cable, wherein the analog test signal does not reach said analog test signal detector if the fault is not present in the cable.

12. The fault detector of claim 11 wherein said analog test signal detector comprises a bandpass filter and a peak detector.

13. The fault detector of claim 11 wherein said analog test signal detector comprises a phase locked loop.

14. The fault detector of claim 11 wherein said splitter/combiner is also connected to source of a data/power signal which is carried by the cable.

15. The fault detector of claim 14 wherein said analog test signal generator provides the analog test signal with a frequency which is lower than a lowest frequency component of the data/power signal.

* * * * *